(12) United States Patent
Nasu et al.

(10) Patent No.: US 8,068,380 B2
(45) Date of Patent: Nov. 29, 2011

(54) BLOCK REPAIR SCHEME

(75) Inventors: Takumi Nasu, Tsuchiura (JP); Takuya Nakanishi, Tsukuba (JP)

(73) Assignee: Micron Technology, Inc., Bosie, ID (US)

(*) Notice: Subject to any disclaimer, the term of this patent is extended or adjusted under 35 U.S.C. 154(b) by 541 days.

(21) Appl. No.: 12/120,871

(22) Filed: May 15, 2008

(65) Prior Publication Data

US 2009/0285043 A1 Nov. 19, 2009

(51) Int. Cl.
*G11C 8/00* (2006.01)
(52) U.S. Cl. ............... 365/230.03; 365/200; 365/185.03
(58) Field of Classification Search ............ 365/230.03, 365/200, 185.03, 185.11, 185.17, 185.33, 365/185.09, 96
See application file for complete search history.

(56) References Cited

U.S. PATENT DOCUMENTS

| | | | |
|---|---|---|---|
| 6,421,286 B1 * | 7/2002 | Ohtani et al. | 365/200 |
| 6,567,322 B1 * | 5/2003 | Mukai et al. | 365/200 |
| 7,389,451 B2 * | 6/2008 | Zhu et al. | 714/711 |
| 7,447,066 B2 * | 11/2008 | Conley et al. | 365/185.03 |
| 2002/0196684 A1 * | 12/2002 | Kyung | 365/200 |
| 2003/0028834 A1 * | 2/2003 | Brown et al. | 714/711 |
| 2004/0130953 A1 * | 7/2004 | Ambroggi et al. | 365/200 |
| 2008/0291765 A1 * | 11/2008 | Smith | 365/222 |
| 2009/0013148 A1 * | 1/2009 | Eggleston | 711/203 |

\* cited by examiner

*Primary Examiner* — Dang Nguyen
(74) *Attorney, Agent, or Firm* — Fletcher Yoder

(57) ABSTRACT

Systems, memory arrays and methods (e.g., methods of block repair) are provided. One such system includes a memory array including a memory bank including a plurality of sections, wherein each of the plurality of sections includes at least one redundant row. Further embodiments provide for mapping non-redundant rows associated with a section associated with a block failure to distributed redundant rows.

11 Claims, 12 Drawing Sheets

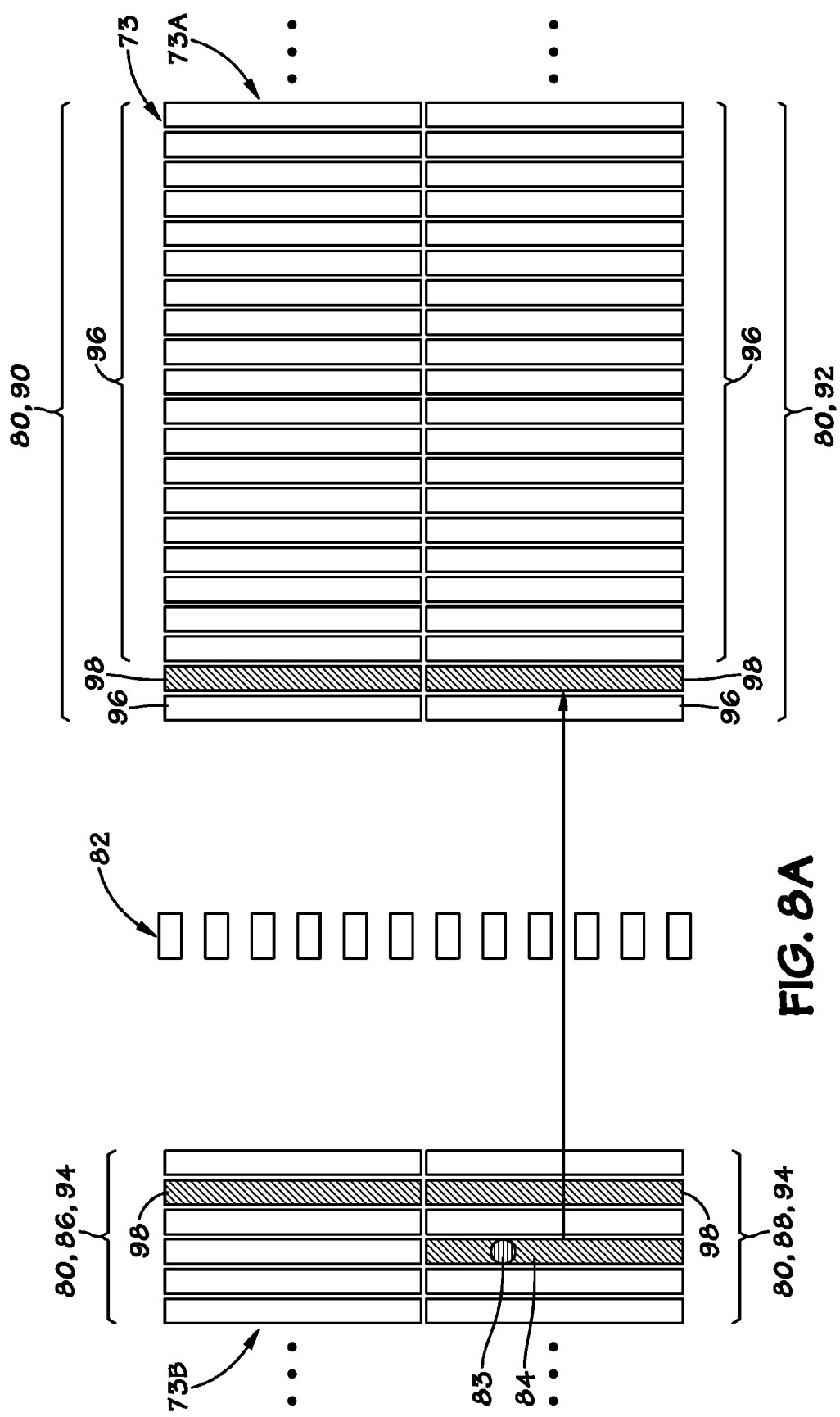

BLOCK REPAIR SCHEME

BACKGROUND

1. Field of the Invention

Embodiments of the invention relate generally to the field of memory devices and more particularly, to a system and method to repair block failures within a memory device.

2. Description of the Related Art

DRAM memory is a volatile memory that can be electrically erased and reprogrammed. DRAM memory generally stores information via an access device and a (e.g., an FET) and a capacitor, which are generally referred to in combination as a "cell." Each cell traditionally stores one bit of information that is represented as a "0" or a "1". The memory device often includes a grid-like arrangement including rows and columns of cells that are referred to as a block. A "row" of cells are those cells that have access devices commonly coupled such that they can be accessed at the same time. Multiple blocks are combined to form a memory array. Unfortunately, not all of the cells and blocks of the memory array are usable. For example, some cells and blocks are bad (e.g., unusable) when the memory device is manufactured and/or fail over the life of the memory device. Memory device designers typically account for this with repair schemes that map the data from bad cells and blocks to good cells and blocks (e.g., redundant rows and/or columns within the memory array). Typically, these repair schemes employ techniques to redirect requests to the good cells (e.g., redundant rows).

Compared to older memory devices that included smaller storage capacities and smaller memory arrays, current memory devices include larger memory arrays with an increased number of cells and blocks. With the increase in the size and in the number of cells and blocks, there is an increase in the probability that cells or blocks within a memory device will experience failures. Accordingly, one repair scheme may include increasing the number of redundant rows and columns to account for the increase in the number of expected failures. Unfortunately, as the redundancy within the memory increases, repair can become increasingly difficult for several reasons. For instance, the mere addition of redundant rows and columns can undesirably increase the size of the memory device, addressing can become complex as the memory array becomes larger and the repair scheme covers the larger area of the memory array, and more devices may be employed to implement the repair scheme.

Embodiments of the present invention may be directed to one or more of the problems set forth above.

BRIEF DESCRIPTION OF THE DRAWINGS

FIG. 8A is schematic diagram of the bank of the DRAM memory array including a bad section and block repair in accordance with one or more embodiments of the present invention;

DETAILED DESCRIPTION OF SPECIFIC EMBODIMENTS

As discussed in further detail below, the disclosed systems and methods relate to a technique for block repair within a memory device. More specifically, certain embodiments include a distribution of redundant rows (e.g., word lines) that enable repair of an entire section of a memory array. For example, certain embodiments include redundant rows distributed in each section of the memory array. Further, embodiments include an addressing technique that enables the transfer of an entire section of the memory array with reduced complexity. For example, in certain embodiments, the block repair includes modifying only a portion of the address, thereby helping to reduce the complexity of address mapping. Further, the block repair addressing technique enables, in certain embodiments, the use of a single fuse block per section of address mapping, thereby reducing the complexity of components employed in the block repair scheme. Before a detailed discussion of the system and methods described in accordance with various embodiments of the present invention, it may be beneficial to discuss embodiments of memory devices that may incorporate the devices described herein, in accordance with embodiments of the present technique.

Figure 1:
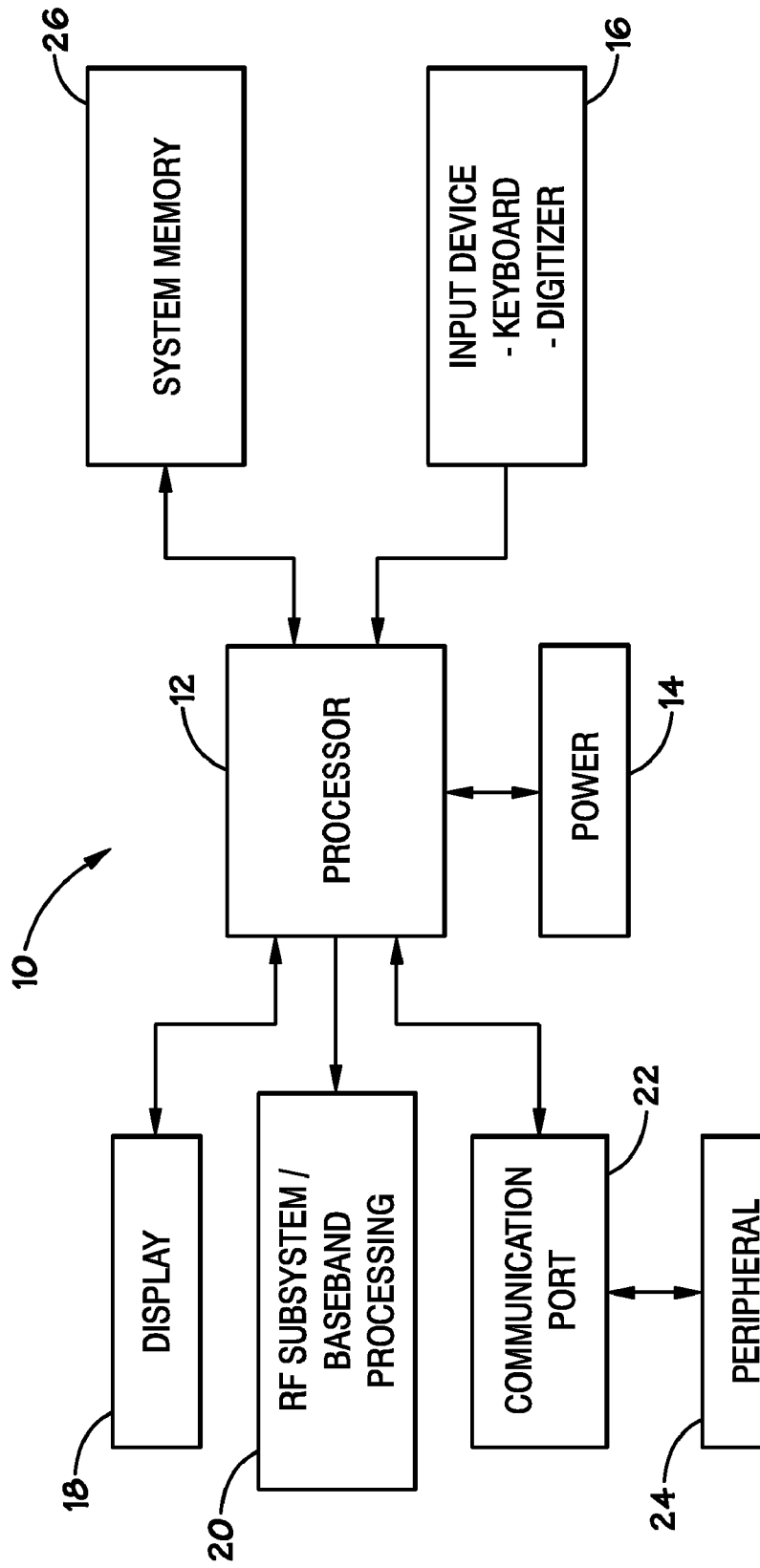
FIG. 1 is a block diagram that illustrates a processor-based device having a memory that includes memory devices fabricated in accordance with one or more embodiments of the present invention.

Turning now to the figures, FIG. 1 includes a block diagram depicting a processor-based system, generally designated by reference numeral 10. The system 10 may be any of a variety of types such as a computer, pager, cellular phone, personal organizer, control circuit, etc. In a typical processor-based device, a processor 12, such as a microprocessor, controls the processing of system functions and requests in the system 10. Further, the processor 12 may comprise a plurality of processors that share system control.

The system 10 typically includes a power supply 14. For instance, if the system 10 is a portable system, the power supply 14 may advantageously include permanent batteries, replaceable batteries, and/or rechargeable batteries. The power supply 14 may also include an AC adapter, so that the system 10 may be plugged into a wall outlet, for instance. The power supply 14 may also include a DC adapter such that the system 10 may be plugged into a vehicle cigarette lighter, for instance.

Various other devices may be coupled to the processor 12 depending on the functions that the system 10 performs. For instance, a user interface 16 may be coupled to the processor 12. The user interface 16 may include buttons, switches, a keyboard, a light pen, a mouse, and/or a voice recognition system, for instance. A display 18 may also be coupled to the processor 12. The display 18 may include an LCD display, a CRT, LEDs, and/or an audio display, for example.

Furthermore, an RF sub-system/baseband processor 20 may also be coupled to the processor 12. The RF sub-system/baseband processor 20 may include an antenna that is coupled to an RF receiver and to an RF transmitter (not shown). A communications port 22 may also be coupled to the processor 12. The communications port 22 may be adapted to be coupled to one or more peripheral devices 24 such as a modem, a printer, a computer, or to a network, such as a local area network, remote area network, intranet, or the Internet, for instance.

Because the processor 12 controls the functioning of the system 10 by implementing software programs, memory is used in conjunction with the processor 12. Generally, the memory is coupled to the processor 12 to store and facilitate execution of various programs. For instance, the processor 12 may be coupled to system memory 26, which may include volatile memory, such as Dynamic Random Access Memory (DRAM) and/or Static Random Access Memory (SRAM). The system memory 26 may also include non-volatile memory, such as read-only memory (ROM), EEPROM, and/or flash memory to be used in conjunction with the volatile memory. As discussed in further detail below, the system memory 26 may include one or more memory devices, such as DRAM memory devices, that include a memory array fabricated and implementing techniques in accordance with one or more embodiments of the present invention.

Figure 2:
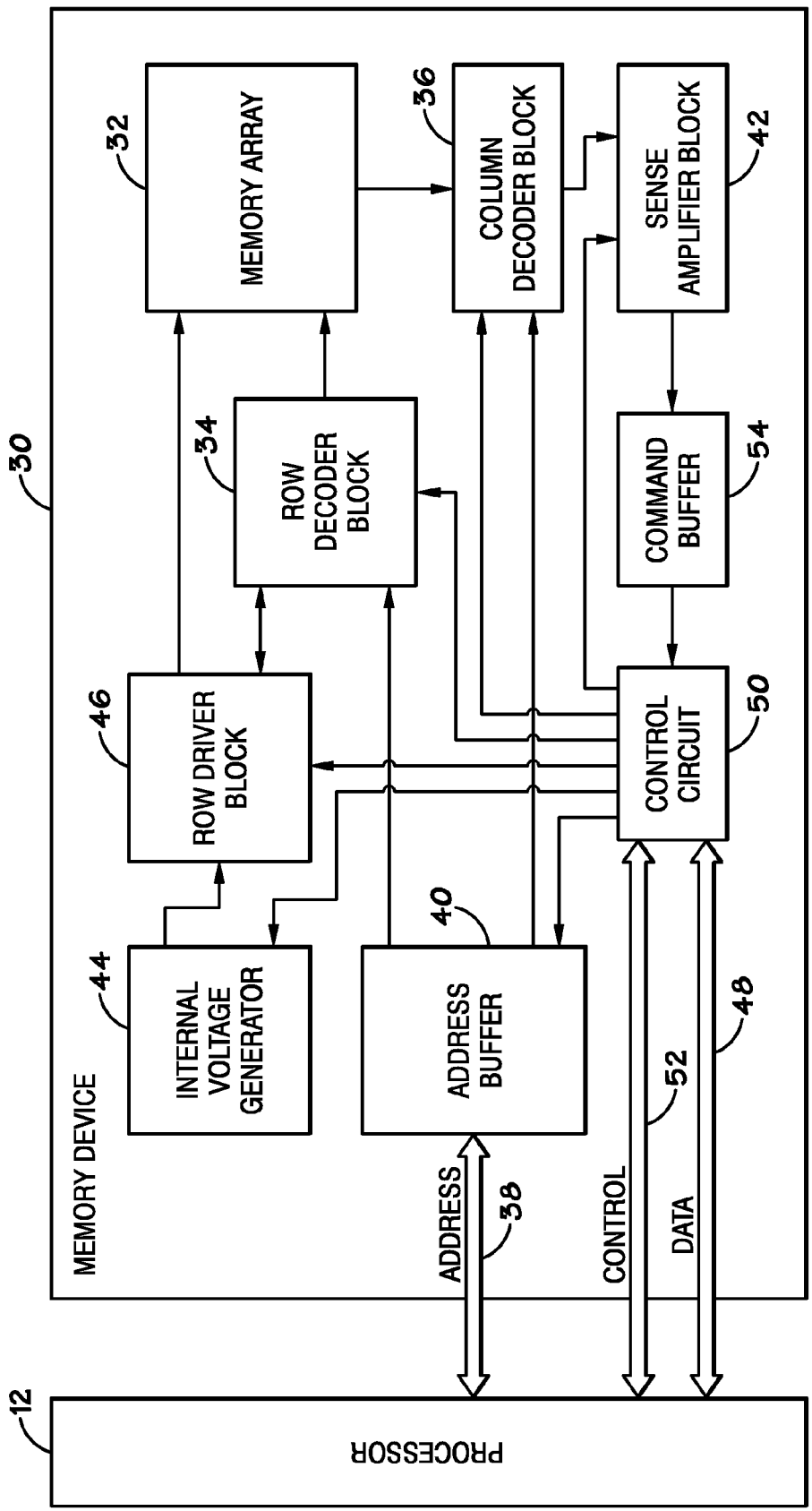
FIG. 2 is a block diagram that illustrates a memory device having a memory array fabricated in accordance with one or more embodiments of the present invention.

FIG. 2 is a block diagram that illustrates a memory device 30 that may be included as a portion of the system memory 26 of FIG. 1. As will be discussed in further detail with respect to FIG. 3, the memory device 30 may be a DRAM memory device. The memory device 30 generally includes a memory array 32. The memory array 32 generally includes many rows and columns of conductive traces arranged in a grid pattern. "Access lines" are used to access cells and generally correspond to the rows or "row lines" of the memory array 32. In the conventional art, they are generally referred to as "word lines." "Data lines" generally correspond to the columns or "column lines." In the conventional art, they are generally referred to as "digit lines" or "bit lines." The size of the memory array 32 (i.e., the number of memory cells) will vary depending on the size of the memory device 30.

To access the memory array 32, a row decoder block 34 and a column decoder block 36 are provided and are configured to receive and translate address information from the processor 12 via the address bus 38 and the address buffer 40 and to access a particular memory cell in the memory array 32. A sense amplifier block 42, having a plurality of the sense amplifiers, is also provided inline with the column decoder 36 and the memory array 32. The sense amplifier block 42 senses and amplifies individual values stored in the memory cells. A row driver block 46 is provided to activate a selected word line in the memory array according to a given row address.

An internal voltage generator 44, such as a voltage generator, is provided to deliver voltages for use within the memory device 30. The internal voltage generator 44 may provide voltage levels for program, read, verify, and erase operations. The internal voltage generator 44 may include a trimming circuit to accurately regulate the voltage level output by the internal voltage generator 44.

During read and program operations, data may be transferred to and from the memory device 30 via the data bus 48. The coordination of the data and address information may be conducted through a control circuit 50. The control circuit 50 may be configured to receive control signals from the processor 12 via the control bus 52. A command buffer 54 may be configured to temporarily store commands of the control circuit 50. The control circuit 50 is coupled to each of the row decoder block 34, the column decoder block 36, the address buffer 40, the sense amplifier block 42, the internal voltage generator 44, the row driver block 46, and the command buffer 54, and is generally configured to coordinate timing and control among the various circuits in the memory device 30.

Figure 3:
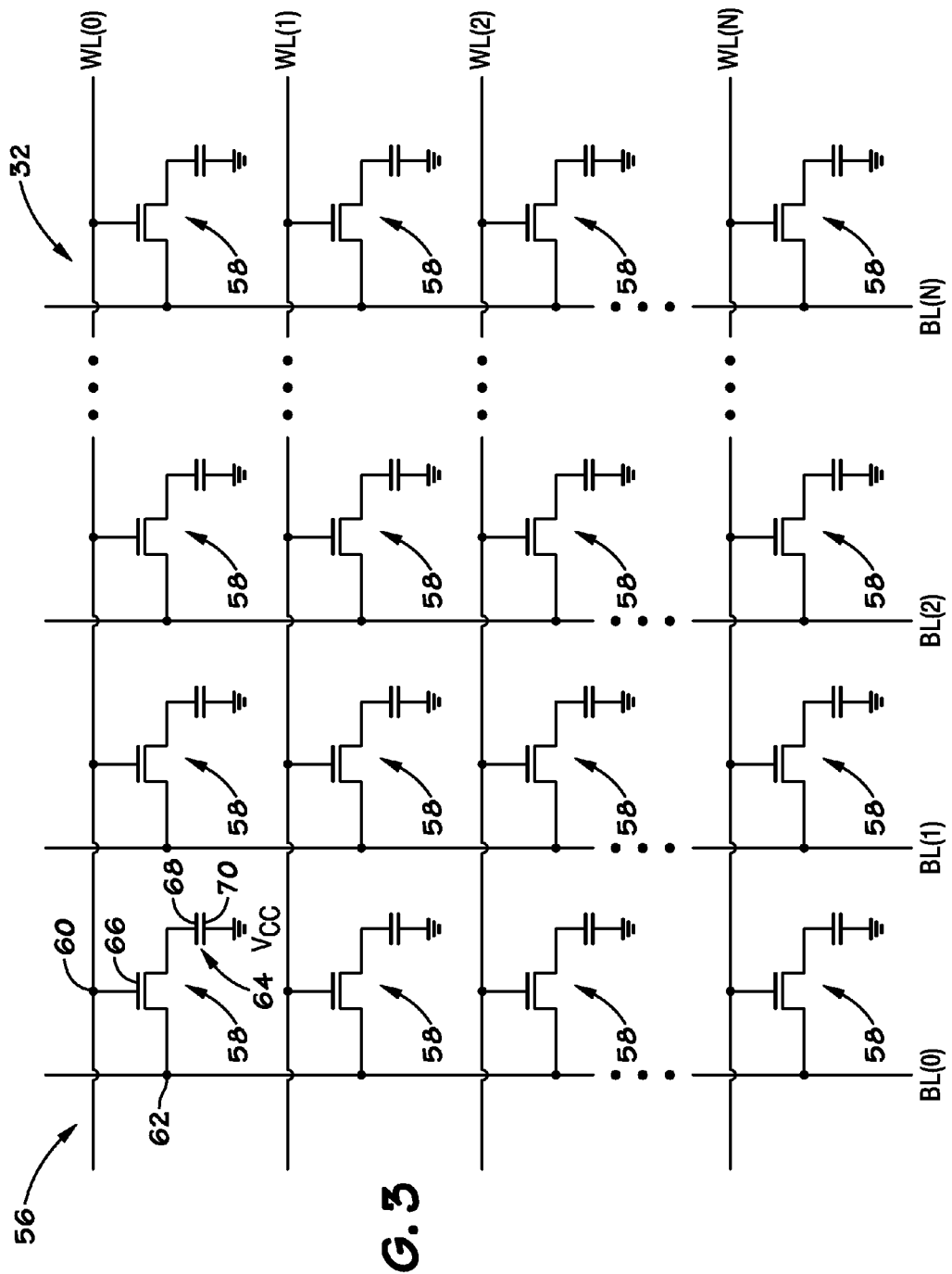
FIG. 3 is a schematic diagram of a DRAM memory array having memory cells fabricated in accordance with one or more embodiments of the present invention.

FIG. 3 illustrates an embodiment of the memory array 32 of FIG. 2. In the illustrated embodiment, the memory array 32 includes a DRAM memory array 56. The DRAM memory array 56 includes rows (or local word lines) WL(0)-WL(N) and intersecting local bit lines BL(0)-BL(N) and a plurality of memory cells 58 that are arranged in generally perpendicular rows and columns. The memory cells 58 in each row are coupled together by a the respective word lines WL(0)-WL(N), and the memory cells 58 in each column are coupled together by a respective bit line or digit line BL(0)-BL(N). Specifically, each memory cell 58 includes a word line node 60 that is coupled to a respective word line WL(0)-WL(N), and each memory cell 58 includes a digit line node 62 that is coupled to a respective bit line BL(0)-BL(N).

Each memory cell 58 includes a memory element 64 that may be coupled to an access device 66. The memory element 64 may be a capacitive memory element such as a storage capacitor, and the access device 66 may be a MOSFET transistor. Capacitors may be used as the storage element in DRAM or other memory types. The gate of the transistor 66 may be coupled to the word line WL(0)-WL(M) to form the word line node 60, and one terminal of the transistor 66 may be coupled to the bit line BL(0)-BL(N) to form the bit line node 62. One plate 68 of the memory element 64 may be coupled to the other terminal of the transistor 66, and the other plate 70 of the memory element 112 may be coupled to a voltage level Vcc, which is typically circuit ground.

Figure 4:
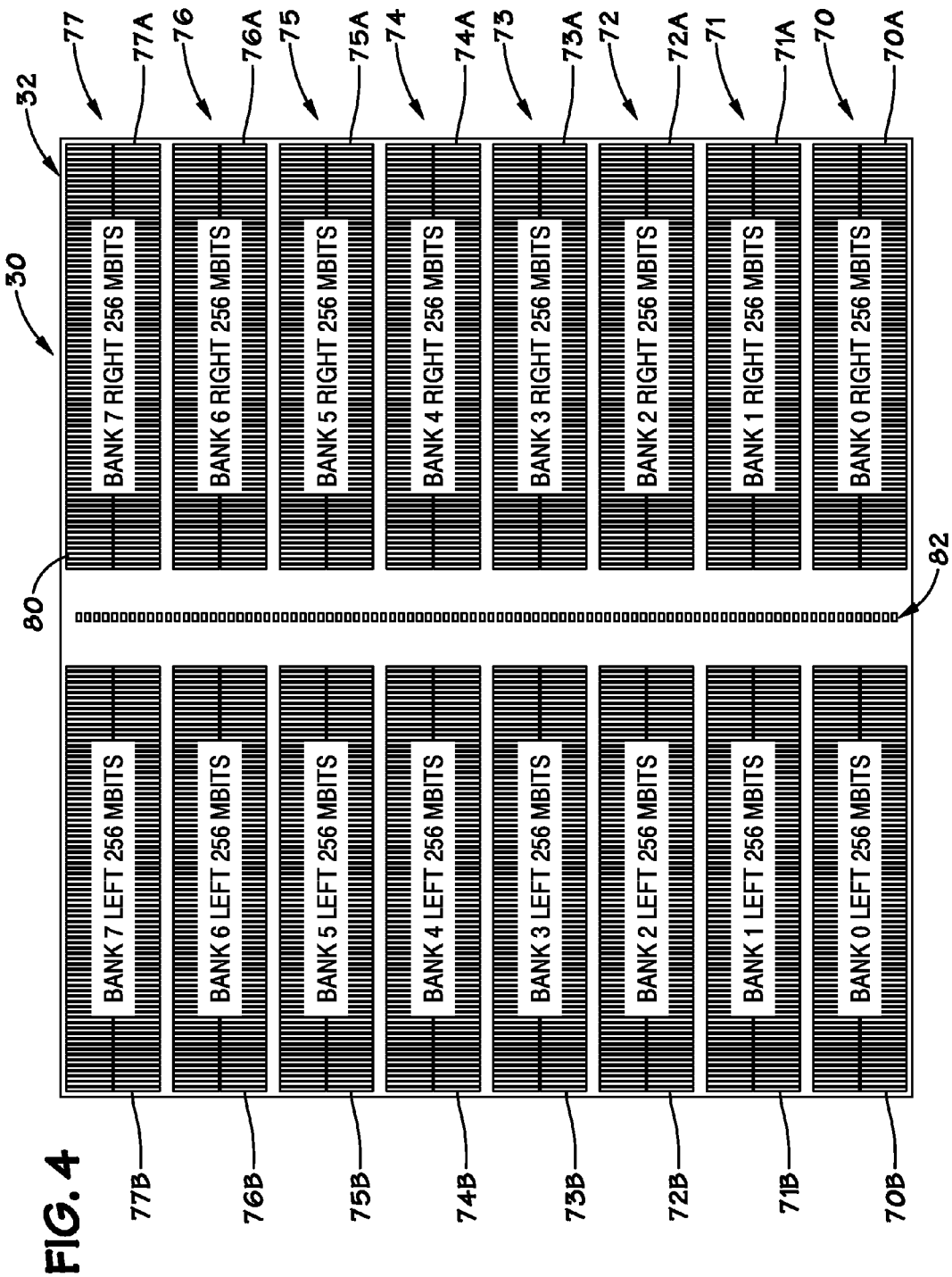
FIG. 4 is a schematic diagram of eight banks of a DRAM memory array fabricated in accordance with one or more embodiments of the present invention.

FIG. 4 illustrates one embodiment of the memory device 30. In the illustrated embodiment, the memory device 30 includes the memory array 32 having eight banks 70-77. Further, in the illustrated embodiment, each of the eight banks 70-77 includes two sub-banks (e.g., banks that are grouped to form the banks 70-77) 70A-77B. The sub-banks 70A-77B are generally designated in groupings of the right sub-banks 70A-77A and the left sub-banks 70B-77B. Each of the sub-banks 70A-77B includes a plurality of sections 80. Each section 80 is represented by one of the boxes that make up each of the sub-banks 70A-77B. A section 80 is a grouping of rows (e.g., word lines). For example, each of the sections 80 includes an array of rows and columns forming the memory array 32 of the memory device 30. In at least one embodiment of the present technique, each section 80 includes 416 rows. The sub-banks 70A-77B include top and bottom groupings of sections 80, in some embodiments. The half-banks 70A-77B are separated by bonding pads 82. The illustrated embodiments includes one configuration of the memory device 30, however, the techniques discussed herein can be used with other configurations of the memory device 30. For example, one embodiment may include any grouping of sections that are used to form the any number of banks.

The size and storage capacity of the memory device 30 can generally be defined by the rows and columns within the memory device 30. For example, in the illustrated embodiment the memory device 30 includes a 4 gigabit (Gb) capacity. Each sub-bank 70A-77B includes a top section including eighty sections 80 and bottom section including eighty sections 80. Each section is 416 word lines by 4096 columns, resulting in a total capacity of 273 megabits (Mbits). As is discussed in further detail below, a portion of the word lines (WL) may be employed for redundant purposes, or the like, resulting in a listed capacity of 256 Mbits for each sub-bank 70A-77B. Thus, the capacity of the memory device 30, including the eight banks 70-77 (i.e., sixteen total sub-banks 70A-77B), is approximately 4096 Mbits, or approximately 4 Gb.

Figure 5:
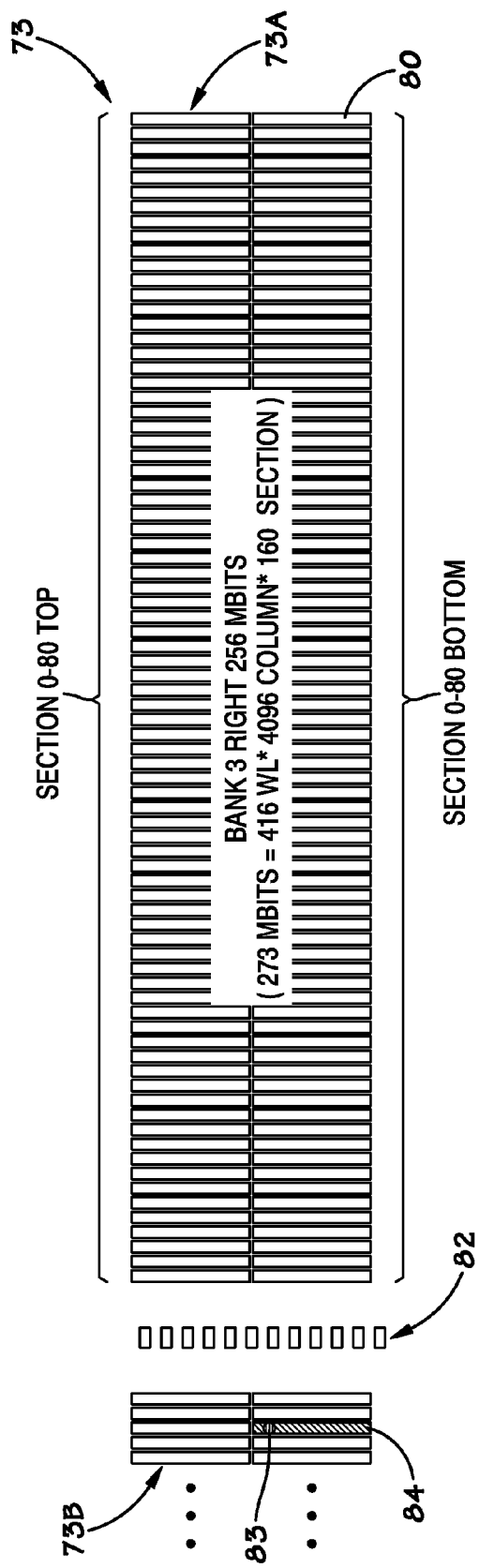
FIG. 5 is a schematic diagram of one bank of the DRAM memory array including a bad section and fabricated in accordance with one or more embodiments of the present invention.

FIG. 5 is a block diagram that illustrates one bank 73 of the memory device 30. The bank 73 includes a block failure in one of its sections 80. More specifically, a block failure (e.g., a bad block) 83 is located within a bad section 84 of the left-sub bank 73B of the bank 73. It is also noted that in the illustrated embodiment, it may be assumed that DRAM is an open bit line architecture where two of the sections operate as half-sections. In other words, effectively, there are eighty sections 80 in the top section of the sub-bank 73A, and they include seventy-nine full sections and two half sections. In operation of the memory device 30, the block failure should be repaired or this memory device 30 may fail. A failed memory device 30 may otherwise be referred to as a dead memory chip. Although the depicted embodiments refer to a single bank (e.g., bank 73) and as discussed in more detail below systems and methods may be employed in a similar manner to any bank or similar configuration of a memory device 30 to provide for block repair in accordance with one or more embodiments of the present techniques.

Figure 6A:
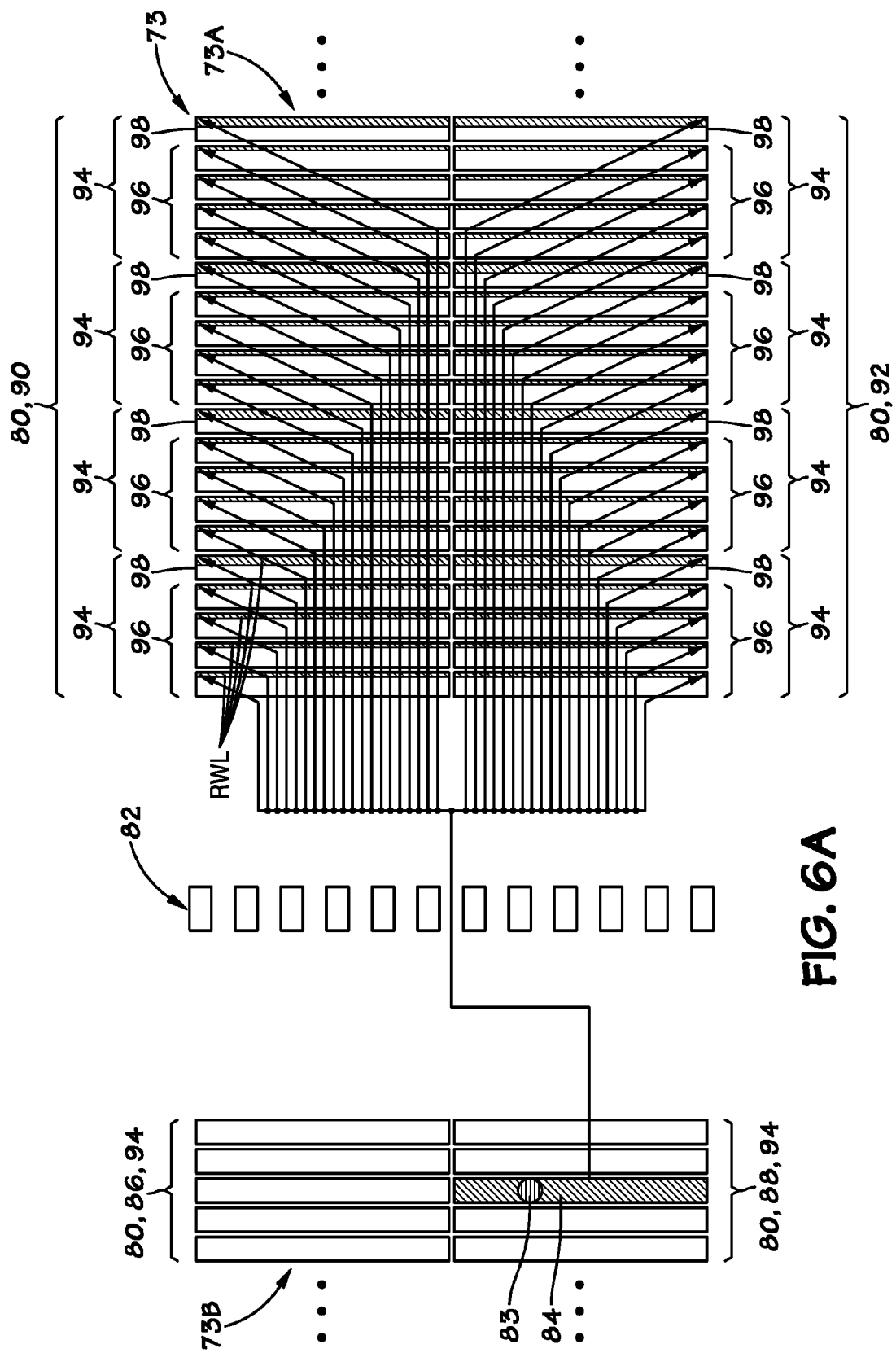
FIG. 6A is a schematic diagram of one bank of the DRAM memory array including a bad section and block repair in accordance with one or more embodiments of the present invention.

FIG. 6A is a block diagram that illustrates the bank 73 in accordance with one or more embodiments of the present technique. More specifically, in the illustrated embodiment only ten of the one-hundred sixty sections 80 of the left bank 73B, and only forty of the of the one-hundred sixty sections 80 of the right bank 73A are illustrated. Of the sections 80 that are illustrated, the left bank 73B includes five top sections 86 and five bottom sections 88, and the right bank 73A includes twenty top sections 90 and twenty bottom sections 92. The five bottom sections 88 of the left bank 73B include the bad section 84 and the bad block 83.

In such an embodiment, five sections 80 may be referred to as a set. For example, in the illustrated embodiment, the sections 80 of the bank 70 are arranged in consecutive sets 94 that are each formed from five consecutive sections 80 (e.g., sections 80 that are located adjacent to one another). As discussed above, each of the sections includes a number of rows, hereinafter referred to as word lines (WL). For example, in some embodiments, each of the sections 80 includes 512, 416, 344, or 256 word lines (WL). Further, as is discussed in greater detail below, each of the sections 80 may include redundant word lines (RWL) (e.g., a redundant row). The redundant word lines (RWL) can be employed for the relocation of data during a block repair, for instance. The redundant word lines can be distributed in various manners throughout the sections 80 to provide sufficient capacity for the relocation of data from a bad block 83 and the associated bad section 84. For example, in the illustrated embodiment, each section includes a redundant word line. Such a configuration where each section includes a redundant word line can be referred to as "distributed" redundant word lines.

Although, redundant word lines (RWL) are not depicted in the left sub-bank 73B, the left sub-bank 73B may include a similar configuration of sections 80 and redundant word lines (RWL) in this and other embodiments.

It will be appreciated that in certain embodiments, it may not be desirable for two adjacent sections 80 to be active at the same time. Thus, it may be desirable in some embodiments for the block repair to map (e.g., relocate, redirect, readdress, etc.) the data and/or requests associated with a word line in a bad section 84 to a redundant word line (RWL) in a section 80 of another (e.g., opposite) sub-bank (e.g., the right and left sub-banks 73a and 73B), or bank, to reduce the likelihood that adjacent sections (e.g., including a section having the redundant word lines (RWL)) may be active at the same time. The illustrated embodiment, and those discussed below, include redundant word lines (RWL) in an opposite sub-bank from that of the bad block 84. However, other embodiments may include redundant word lines (RWL) in the same sub-block.

In one embodiment each of the sections 80 includes a redundant word line (RWL). For example, in the illustrated embodiment, each of the sets 94 includes first sections 96 and a second section 98 that includes one or more redundant word lines (RWL) in excess of the redundant word lines (RWL) of the first sections. For example in one embodiment each of the first sections 96 includes four redundant word lines (RWL) and the second section 98 includes thirty-six redundant word lines (RWL). Accordingly, each set 96 includes a total of fifty-two (52=(4*4)+36) redundant word lines (RWL), and the half-bank 73A includes a total of 1664 (1664=52*160/5) redundant word lines (RWL). Similar arrangements may be employed in other embodiments that employ sections 80 having any number of word lines (WL). For example, redundant word lines (RWL) may be added to each section 80 in a memory device 30 that employs 512, 416, 344, or 256 word lines (WL) per section.

In operation of an embodiment including a redundant word line (RWL) in each section 80, block repair can be employed to provide for relocation of an entire section (e.g., bad section 84) upon a block failure, or similar failure. In one embodiment, the data associated with each word line of a bad section (e.g., failed section) is relocated to a redundant word line (RWL). For example, in the illustrated embodiment, the requests and/or data associated with the 416 word lines of the bad section 84 are map (e.g., relocate, redirect, readdress, etc.) to 416 redundant word lines (RWL) of the eight illustrated sets 94 of the right bank 73A. This provides a one-to-one correspondence between the number of word lines in the bad section 84 and the number of redundant word lines (RWL) employed to repair the bad section 84 in light of the bad block 83.

The relocation of data from the bad section 84 to the redundant word lines (RWL) can be performed via address mapping, in one embodiment. For example, in one embodiment, address mapping includes receiving an address indicative of a word line of the bad section 84 and associating that address with one or more redundant word lines (RWL). In other words, when an address is received that points to a cell within the bad section 84, address mapping could include redirecting the associated operation to a good cell within the redundant word line (RWL), and, thus, the redundant word line is employed to repair the word line.

Figure 6B:
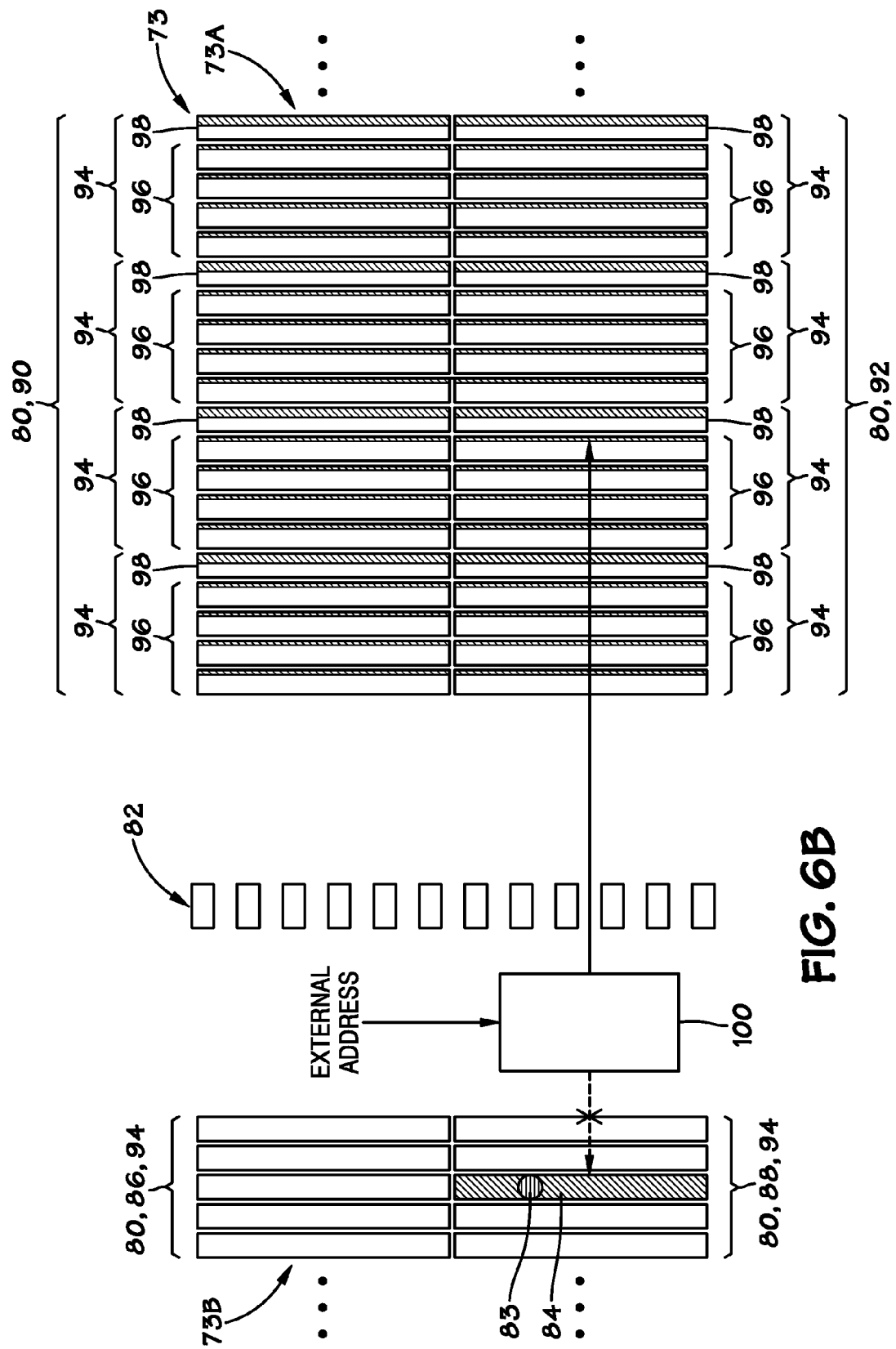
FIG. 6B is a schematic diagram of the bank of the DRAM memory including a fuse block in accordance with one or more embodiments of the present invention.

FIG. 6B is a block diagram that illustrates one embodiment of the memory device 30 that includes a map or fuse block (e.g., a fuse, antifuse, nonvolatile elements, etc.) 100 in accordance with one or more embodiments of the present technique. The fuse block 100 may be employed to facilitate the mapping of requests associated with the bad section 84 to the redundant word lines (RWL). In one embodiment, the fuse block 100 employs address mapping to route a request relating to an address (e.g., an external address) to the internal address (e.g., a normal internal address or modified internal address, such as a redundant address). For example, where an operation of the memory requests access to an address of the memory device 30, the fuse block 100 either maps the request to the normal internal address or maps the request to a redundant address. In the illustrated embodiment, the incoming external address indicates a request to access a memory location along a word line within the bad section 84. However, instead of directing the request to the word line within the bad section 84, the fuse block 100 directs the request to a redundant word line (RWL) in one of the first sections 96. Other external address requests may be directed to any of the redundant word lines (RWL) within the block 73, for instance. Accordingly, the fuse block 100 provides a seamless interface to the external address request.

In one embodiment, a single fuse block 100 is employed for each bad section that is repaired. For example, in the illustrated embodiment, the fuse block 100 includes a configuration to map all of the addresses associated with the bad section 84 to the redundant word lines (RWL). In such an embodiment, where the block repair is configured to repair a second or third block, for instance, a second or third fuse block 100 would be provided.

In such an embodiment, each fuse block 100 may include a predetermined mapping to each of the redundant word line (RWL). For example, the fuse block 100 may include a predetermined routing to 416 redundant word lines (RWL) in anticipation of a block failure. When a block failure occurs, the fuse block 100 maps the word lines 0-416 of the bad section 84 to the redundant word lines 0-416, respectively. Accordingly, the fuse block 100 merely recognizes a request to the bad section 84 irrespective of the portion of the address relating to the individual word lines 0-416, and then maps the request directed to the word lines 0-416 to the respective redundant word line 0-416 distributed throughout the first sections 96 and the second sections 98 of the right sub-bank 73. For example, a redundant word line (RWL) for the block repair is activated by an alternative section select and redundancy word line select signal when the incoming address matches an address associated with the bad block 84 stored in the fuse block 100. Further, because a single fuse block 100 is employed for the block repair of each bad section 84, the location of the activated redundant word lines (RWL) is predetermined, enabling embodiments of the block repair to repair a bad section 84 with redundant word lines (RWL) located in sections outside of the local region. In other words, the redundant word lines (RWL) do not have to be located within the same bank 73, but may be located globally in another bank (e.g., banks 70A-77B). Embodiments of the fuse block 100 and related techniques are discussed in detail below with regard to FIG. 10.

Figure 7:
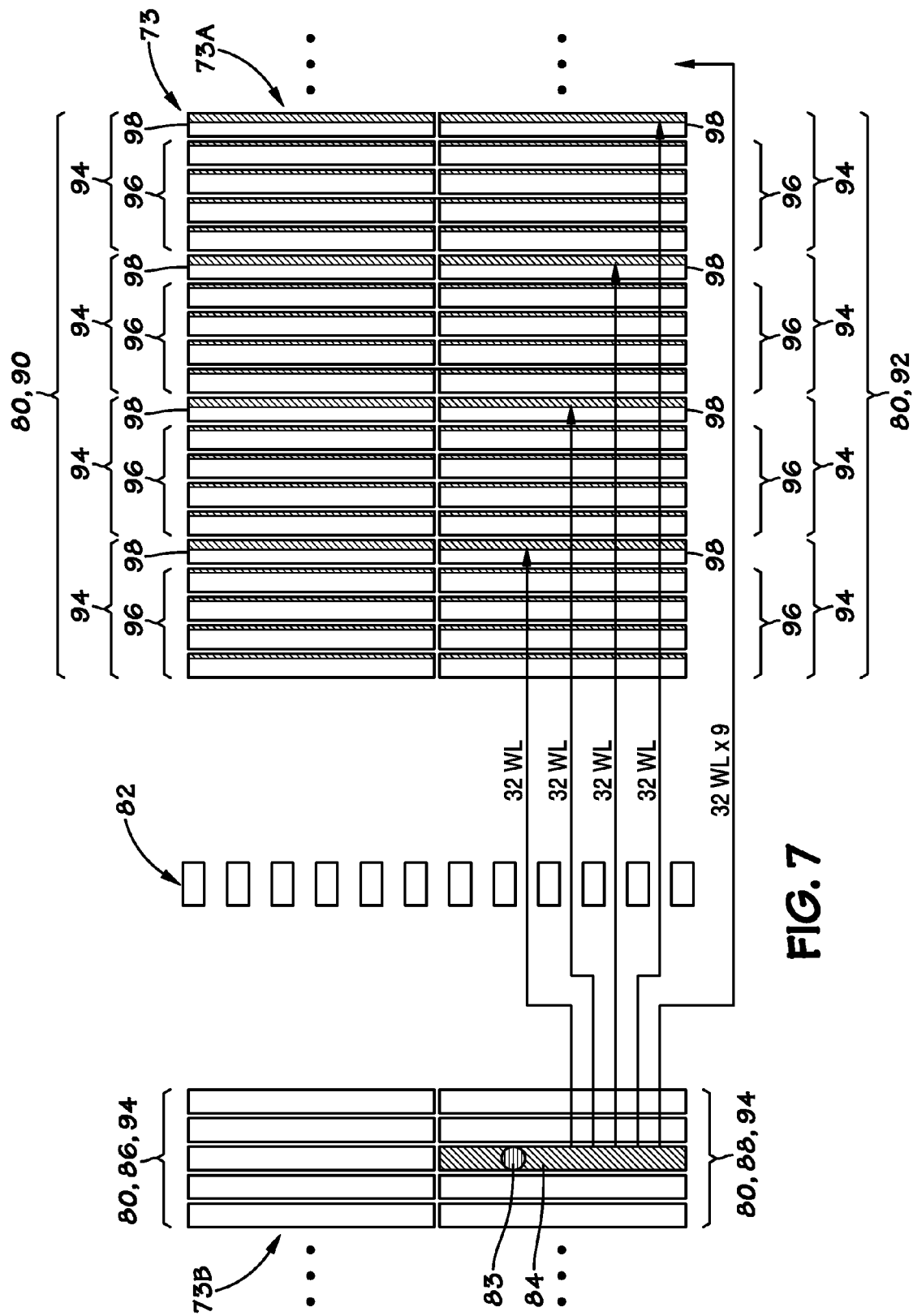
FIG. 7 is schematic diagram of the bank of the DRAM memory array including a bad section and block repair in accordance with one or more embodiments of the present invention.

FIG. 7 is a block diagram that illustrates the bank 73 in accordance with one or more embodiments of the present technique. More specifically, in the illustrated embodiment, the bank 73 includes a similar configuration to that depicted and discussed with regard to FIG. 6A, including a distribution of redundant word lines (RWL) in each of the sections 80. However, in the illustrated embodiment of FIG. 7 less than all of the sections 80 in each set 94 are employed during the block repair. For example, only the second sections 98 are employed for the block repair. Further, in the illustrated embodiment, only a portion of the redundant word lines (RWL) in the second section 98 are employed for the block repair. For example, only thirty-two of the thirty-six redundant word lines (RWL) are employed for the block repair. To account for all of the word lines of the bad section 84 that are repaired, the block repair employs an increased number of sets 94. For example, in the illustrated embodiment, thirty-two redundant word lines (RWL) of thirteen second sections 98 of thirteen sets 94 (32*13=416) are employed to enable the block repair to redirect requests associated with the 416 word lines (WL) of the bad section 84. Although, in the illustrated embodiment all of the second sections 98 employed are located in bottom sections 92, other embodiments may include any variation or combination of the arrangement of the second sections 98, the first section 96, and their respective redundant word lines (RWL).

In operation of an embodiment employing redundant word lines (RWL) in second sections 98, block repair can be employed to provide for relocation of an entire section (e.g., bad section 84) upon a block failure, or similar failure. In one embodiment, the data associated with each word line of a bad section (e.g., failed section 84) is relocated to the redundant word lines (RWL) in the second sections 98. For example, in the illustrated embodiment, the request and/or data associated with the 416 word lines of the bad section 84 are redirected and/or relocated to 416 redundant word lines (RWL) of the nine second sections 98 of the right bank 73A. This provides a one-to-one correspondence between the number of word lines in the bad section 84 and the number of redundant word lines (RWL) employed to repair the bad section 84 in light of the bad block 83.

In certain embodiments, a fuse block 100 may be employed to facilitate the mapping of data associated with the bad section 84 to the redundant word lines (RWL). For example, similar to the embodiments discussed with regard to FIG. 6B, in one embodiment, a single fuse block 100 is employed for each bad section that is repaired. However, in the illustrated embodiment, the fuse block 100 maps the addresses associated with the bad section 84 to redundant word lines (RWL) located only within the second sections 98. For example, when a block failure occurs, the fuse block 100 maps the word lines 0-416 of the bad section 84 to the redundant word lines 0-416 that are compiled from thirty-two lines in each of the thirteen second sections 98, respectively. In an embodiment, where the block repair is configured to repair a second or third block, for instance, a second or third fuse block 100 could be provided. Embodiments of the fuse block and related techniques are discussed in detail below with regard to FIG. 10.

Figure 8B:
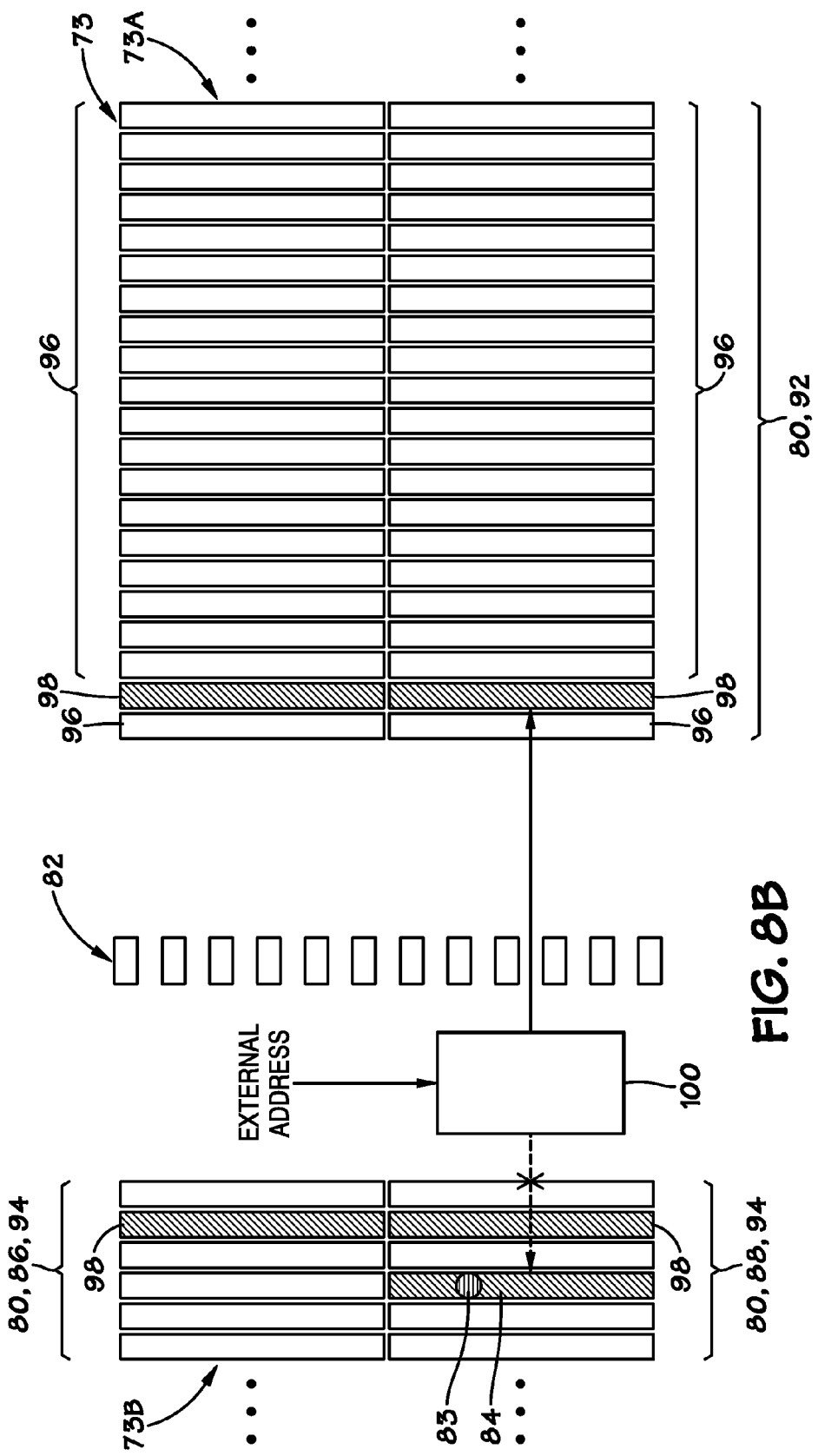
FIG. 8B is a schematic diagram of the bank of the DRAM memory of FIG. 8A including a fuse block in accordance with one or more embodiments of the present invention.

FIG. 8A is a block diagram that illustrates the bank 73 in accordance with one or more embodiments of the present technique. More specifically, in the illustrated embodiment, the bank 73 includes a similar configuration to that depicted and discussed with regard to FIG. 6A. However, in the illustrated embodiment, one or more sections 80 include redundant word lines (RWL) in equal number to the number of word lines in one section 80.

In one embodiment, at least one section 80 of a sub-bank includes a number of redundant word lines (RWL) that are equal to or greater than the number of word lines to be repaired by the block repair. For example, in the illustrated embodiment, the bottom sections 92 of the right sub-bank 73A include first sections 96 that do not include any redundant word lines (RWL) and a second section 98 that includes 416 redundant word lines (RWL). In such an embodiment, the bad section 84 includes 416 word lines. Further, in one embodiment, the bank 73 may include more than one second section 98 that includes a number of redundant word lines (RWL) that are equal to or greater than the number of word lines to be repaired by the block repair. For example, the illustrated embodiment includes a second section 98 in each of the top sections 86 and 90 and the bottom sections 88 and 92 of the right and left sub-banks 73A and 73B. Other embodiments may include any number of second sections 98 dispersed throughout the bank 73. For example, one embodiment may include two or more second sections 98 in each of the top sections 86 and 90 and/or the bottom sections 88 and 92 of the right and/or left sub-banks 73A and 73B. Further, other embodiments may include redundant word lines (RWL) distributed within other sections 80. For example, in one embodiment, the first sections 96 may also include redundant word lines (RWL).

In operation of an embodiment employing redundant word lines (RWL) only in a second section 98, block repair can be employed to provide for relocation of an entire section (e.g., bad section 84) upon a failure (e.g., a block failure). In one embodiment, the request and/or data associated with each word line of a bad section (e.g., failed section) are redirected and/or relocated to the redundant word lines (RWL) in the second section(s) 98. For example, in the illustrated embodiment, the data associated with the 416 word lines of the bad section 84 are relocated to 416 redundant word lines (RWL) of the second section 98 of the right bank 73A. This provides a one-to-one correspondence between the number of word lines in the bad section 84 and the number of redundant word lines (RWL) employed to repair the bad section 84 in light of the bad block 83.

In certain embodiments, a fuse block 100 may be employed to facilitate the mapping of data associated with the bad section 84 to the redundant word lines (RWL). For example, similar to the embodiments discussed with regard to FIG. 6B, in one embodiment, a single fuse block 100 is employed for each bad section 84 that is repaired. However, in the illustrated embodiment, the fuse block 100 maps the addresses associated with the bad section 84 to redundant word lines (RWL) located only within the second sections 98. For example, when a block failure occurs, the fuse block 100 maps the word lines 0-416 of the bad section 84 to the redundant word lines 0-416 that are contained within the second section 98. In an embodiment, where the block repair is configured to repair a second or third block, for instance, a second or third fuse block 100 could be provided. Embodiments of the fuse block 100 and related techniques are discussed in detail below with regard to FIG. 10.

Figure 9:
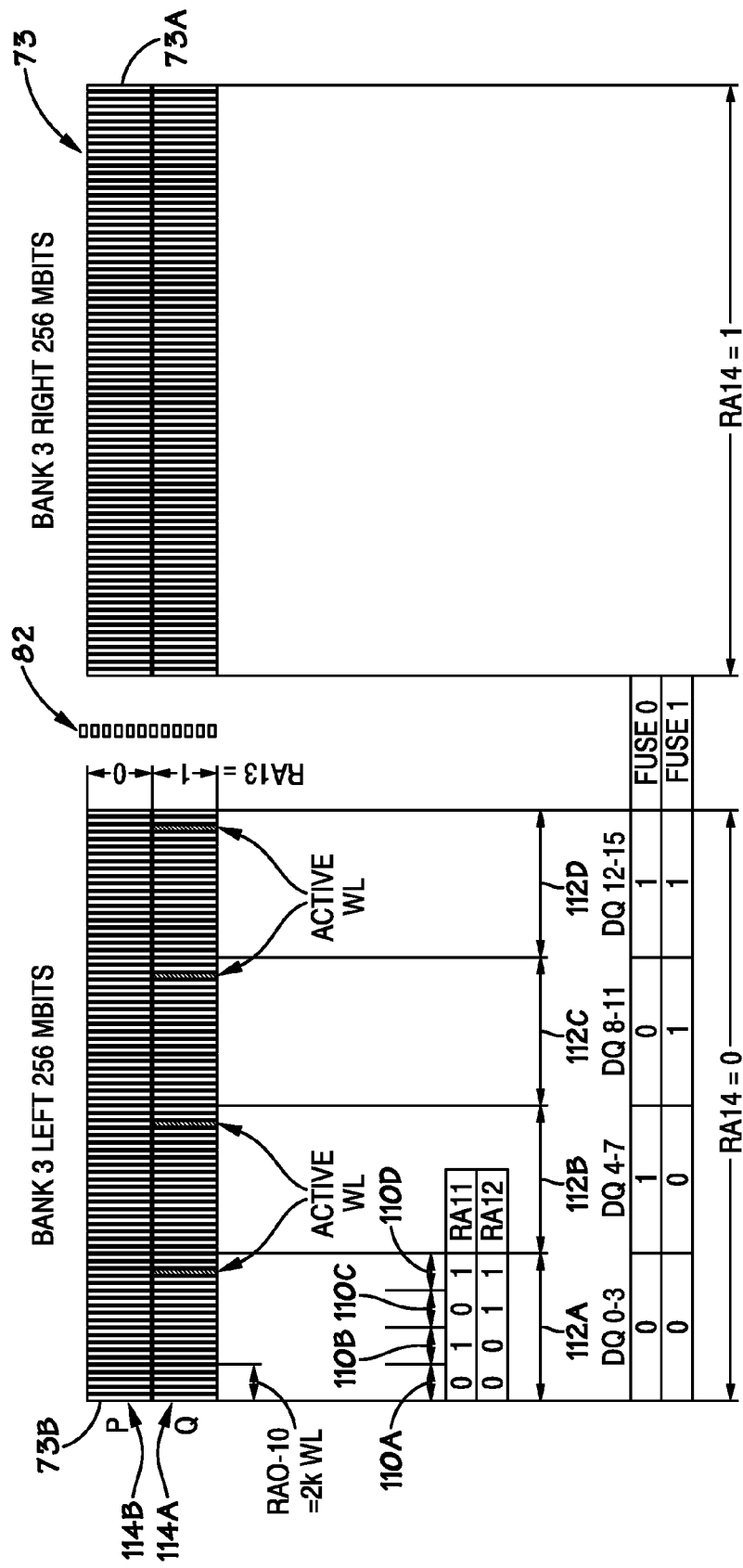
FIG. 9 is a schematic diagram illustrating an addressing scheme of one bank of the DRAM memory array in accordance with one or more embodiments of the present invention.
Figure 10:
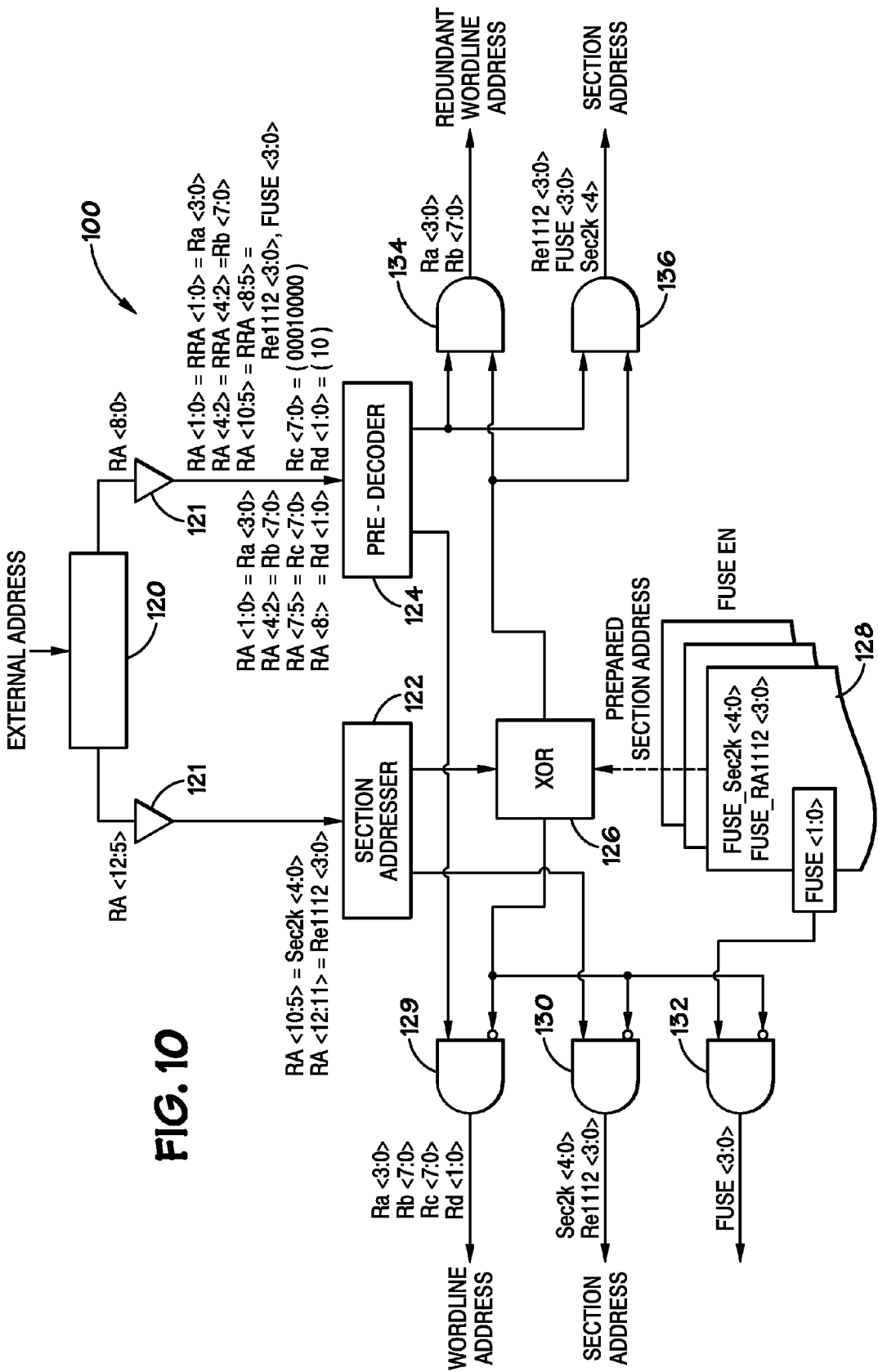
FIG. 10 is a block diagram of a fuse block used for block repair of the DRAM memory in accordance with one or more embodiments of the present invention.

Turning now to FIGS. 9-10, the figures illustrate embodiments of an addressing scheme and embodiments of the fuse block 100 that can be employed to provide address mapping in accordance with one or more embodiments of the present technique. FIG. 9 is a block diagram that depicts one embodiment of addressing employed in accordance with one or more embodiments of the present techniques. More specifically, the illustrated embodiment includes one bank 73, including the right bank 73A and the left bank 73B, along with an illustration of bits associated with an external address configured to identify one word line of the bank 73. In the illustrated embodiment, each section 80 includes 416 word lines, sets 110A-110D each includes five of the sections 80, sub-sub-banks 112A-112D each includes four of the sets 110A-110D, a bottom sub-bank 114A and top sub-bank 114B includes four of the sub-sub-banks 112A-112D, and each sub-bank (e.g., right sub-bank 73A or sub-left bank) includes the bottom sub-bank 114A and top sub-bank 114B. The location of a word line within this structure can be identified by an external address.

The external address, in one embodiment, includes an address that is forwarded to a circuit (e.g., the fuse block 100) that interprets the external address and directs the request and data to the word line (i.e., internal address) associated with the external address. The external address may include a string of a plurality of bits that are combined to identify a location within the memory device 30. For example, in the illustrated embodiment, the external address includes 15 bits (bit 0-bit 14) that identify right sub-bank 73A or sub-left bank, the bottom sub-bank 114A or top sub-bank 114B, one of the sub-sub-banks 112A-112D, one of the sets 110A-110D, and one of the word lines within one of the sections 80 within the set 110A-110D. In one embodiment, the upper bits (e.g., bit 14) distinguish higher levels (e.g., the right sub-bank 73A or left sub-bank 73B) of the internal address and the lower bits (e.g., bits 10-0) identify the lower levels (e.g., the word line) of the internal address. For example, in the illustrated embodiment, bit14 is a 0 for the left sub-bank 73B and a 1 for the right sub-bank 73A, bit13 is a 0 for the top sub-bank 114B and a 1 for the lower sub-bank 114A, bit12 and bit11 identify the set 110A-110D, and bit10 through bit0 identify one of the word lines in the set (e.g., one of 2048 non-redundant word lines in a set of five sections that include 416 non-redundant word lines per section and 32 redundant word lines per set). In such an embodiment four word lines (Active WL) are active at a time and additional fuse bits are employed in some embodiments to further identify the sub-sub-bank 112A-112D that is identified by the external address. For example, fuse bits Fusebit0 and Fusebit 1 (labeled as Fuse0 and Fuse1) are employed to identify the sub-sub-banks 112A-112D, in one embodiment. The fuse bits, Fusebit 0 and Fusebit 1, include additional bits that are located before, after, or integral to bit14-bit0 of the external or internal address, for example.

FIG. 10 is schematic diagram illustrating one embodiment of the fuse block 100 in accordance with one or more embodiments of the present technique. In the illustrated embodiment, the address (e.g., an external address) is input to pre-stage 120. In one embodiment, the pre-stage 120 includes row address buffers and row address registers. In some embodiments, the pre-stage 120 is separate from the fuse block 100. Where the address includes the fifteen bit address discussed with regard to FIG. 10, the output of the pre-stage 120 includes row address bits (RA) <12:5> and RA<8:0> that are input to inverters 121 before being input to a section addresser 122 and a pre-decoder 124, respectively. At the section addresser 122, RA<10:5> are decoded to Sec2k<4:0> that are employed to select one section 80 of the five sections in the sets 110A-110D, in one embodiment. The RA<12:11> are decoded to Re1112<3:0> to select one of the sets 110A-110D. Sec2k<4:0> and Re1112<3:0> are compared with a section address forwarded to a comparator 126 from a fuse programmer 128. The fuse programmer 128 maintains stored values that identify bad sections, and the values can be compared to the values parsed from the external address to determine if the incoming request should be directed to the address of the requested section or to one or more redundant word lines employed by block repair to replace the requested section (e.g., bad section 84). For example, in the illustrated embodiment, the fuse programmer 128 includes values Fuse_Sec2k<4:0> and Fuse_RA1112<3:0> that are input to the comparator 126 and compared to Sec2k<4:0> and Re1112<3:0>, respectively.

Fuse <3:0> are generated internally to disable only one set of the four word lines. In normal functions, four WL will be activated at one time in this assumption in FIG. 9, and 128 bits of data will be read or written in parallel. However, only one WL of the four active WL is replaced when only one section is replaced in the bank. Although the one replaced WL can not be identified by any external address, the internal address FUSE<3:0> can disable only one WL in the bad section while leaving other three WL active, and the address FUSE<3:0> can activate only one section in the bank for the block repair that includes the redundant row. The internal address FUSE<3:0> to disable one WL are not necessary if there is not any issue of power increase and/or function errors in the device when a bad WL is activated. To enable a redundant row, the address lines of FUSE<3:0> can be used to select one section if the redundant rows are distributed, as depicted in FIGS. 6A-7. However, addresses on FUSE<3:0> are not generated with fuse0 and fuse1 in this case, and they are generated with external addresses to activate one row. If the block repair scheme is similar to that discussed with regard to FIGS. 8A-8B (e.g., is not a distributed type), only one signal is used to activate the redundant rows and FUSE<3:0> may not be used.

Where it is determined (e.g., determined at the comparator 126) that the external address is not associated with a bad section, the fuse block 100 operates to direct the request to an unmodified internal address (which can also be thought of as the normal path address). In such an embodiment, RA<8:0> are pre-decoded by the pre-decoder 124 to Ra<3:0>, Rb<7:0>, Rc<7:0> and Rd<1:0>. Ra<3:0>, Rb<7:0>, Rc<7:0>, and Rd<1:0> are forwarded to and output by an address factor driver 129, Sec2k<4:0> and Re1112<3:0> are forwarded to and output by an address factor driver 130, and Fuse <3:0> is forwarded to and output by an address factor drivers 132. Ra<3:0>, Rb<7:0>, Rc<7:0> and Rd<1:0> identify the word line addresses, Sec2k<4:0> and Re1112<3:0> identify the addressed set and section, and Fuse <3:0>.

Where it is determined (e.g., determined at the comparator 126) that the external address is associated with a bad section, the fuse block 100 operates to direct the request to a modified internal address (e.g., a redundant address). In such an embodiment, RA<1:0>, RA<4:2>, and RA<10:5> are respectively re-labeled redundant row addresses (RRA) <1:0>, RRA<4:2>, and RRA1112<3:0>. RRA<1:0> are pre-decoded to Ra<3:0>, RRA<4:2> are pre-decoded to Rb<7:0>, RA<7:5> are pre-decoded to Rc<7:0>, RA<8> is pre-decoded to Rd<1:0>, and RRA<8:5> is pre-decoded to R1112<3:0> and Fuse <3:0>. Ra<3:0> and Rb<7:0> are employed as the redundant word line address and are used to select one of thirty-two word lines in the selected redundant section, and Rc<7:0>, Rd<1:0> and Sec2k<4> have predetermined fixed addresses (e.g., 00010000, 10, and 4 respectively) that are associated with given sections having redundant word lines. Accordingly, Ra<3:0> and Rb<7:0> are forwarded through address factor drivers 134 as the redundant word line address, and Re1112<3:0>, Fuse<3:0> and Sec2k<4> are forwarded through address factor drivers 136 as the section address.

In operation, the fuse block 100 may receive the external address, identify a first portion of the external address that relates to a section, compare the first portion of the external address to a value (e.g., predetermined addresses of one or more bad sections), and map the address to a normal internal address (e.g., row address and section address) if it is determined that the first portion of the address is not subject to a block repair (or not in need of a block repair) or map the address to a modified internal address (e.g., a redundant word line address and redundant section address) if it is determined that the first portion of the address is subject to a block repair (or in need of a block repair). In such an arrangement, the fuse block 100 incorporates a predetermined map of redundant word lines and can map any section to the predetermined redundant word lines. Accordingly, only one fuse block 100 is required to replace and entire bad section or more than one bad section. Although the previous discussion includes one embodiment of the fuse block 100, other embodiments may be employed. For example, a single fuse block 100 may include multiple repair addresses and a mapping sufficient to relocate a plurality of sections to redundant word lines.

While the invention may be susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A system, comprising:
   a memory array comprising:
      a memory bank comprising a plurality of sections, wherein each of the plurality of sections comprises at least one redundant row, wherein the plurality of memory sections comprises a first section having a first number of redundant rows and a second section having a second number of redundant rows, wherein the second number of redundant rows is greater than the first number of redundant rows.

2. The system of claim 1, wherein the plurality of memory sections comprise sets, wherein each set comprises a plurality of the first sections and one of the second sections, and wherein the first sections and the second section of the respective one of the sets are adjacent one another.

3. The system of claim 1, wherein the memory array is configured to perform a block repair via mapping of all of the non-redundant rows of a section including a bad block to the redundant rows of the first section and the redundant rows of the second sections.

4. The system of claim 1, wherein the memory array is configured to perform a block repair via mapping of all of the non-redundant rows of a section including a bad block to the redundant rows of only the second section.

5. The system of claim 1, further comprising a fuse block.

6. The system of claim 5, wherein the fuse block is configured to map all of the rows of a section comprising a bad block to one or more of the redundant rows.

7. The system of claim 5, wherein the fuse block comprises a predetermined mapping.

8. The system of claim 7, wherein the predetermined mapping is configured to map the rows of any section to predetermined redundant rows.

9. The system of claim 1, further comprising a plurality of fuse blocks, wherein each of the plurality of fuse blocks is configured to repair a single bad section.

10. A method, comprising:
    performing a row block repair via mapping one or more non-redundant rows of a bad section to one or more redundant rows of a bank, wherein the bank comprises one or more redundant rows in each section of the bank, wherein mapping the one or more non-redundant rows of the bad section to the one or more redundant rows of the bank comprises mapping a first non-redundant row to a first section that comprises a first number of redundant rows and mapping a second non-redundant row to a second section that comprises a second number of redundant rows, wherein the second number is greater than the first number.

11. The method of claim 10, wherein a total number of the one or more redundant rows is greater than a total number of non-redundant rows of the bad section.

* * * * *

UNITED STATES PATENT AND TRADEMARK OFFICE
CERTIFICATE OF CORRECTION

PATENT NO. : 8,068,380 B2  
APPLICATION NO. : 12/120871  
DATED : November 29, 2011  
INVENTOR(S) : Takumi Nasu et al.

Page 1 of 1

It is certified that error appears in the above-identified patent and that said Letters Patent is hereby corrected as shown below:

On the title page, item (73), in "Assignee", in column 1, line 1, delete "Bosie, ID" and insert -- Boise, ID --, therefor.

Signed and Sealed this  
Twenty-first Day of February, 2012

David J. Kappos  
*Director of the United States Patent and Trademark Office*